(12) United States Patent
Hu et al.

(10) Patent No.: US 6,576,404 B2
(45) Date of Patent: Jun. 10, 2003

(54) CARBON-DOPED HARD MASK AND METHOD OF PASSIVATING STRUCTURES DURING SEMICONDUCTOR DEVICE FABRICATION

(75) Inventors: John Hu, Sunnyvale, CA (US); Ana Ley, Sunnyvale, CA (US); Philippe Schoenborn, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 24 days.

(21) Appl. No.: 09/741,568

(22) Filed: Dec. 19, 2000

(65) Prior Publication Data

US 2002/0074313 A1 Jun. 20, 2002

(51) Int. Cl.$^7$ .............................. G03C 5/00; G03F 9/00
(52) U.S. Cl. ....................... 430/317; 430/318; 430/313; 430/5
(58) Field of Search ................. 430/322, 323, 430/324, 313, 314, 316, 317, 318, 5; 216/12, 13, 17, 18, 74, 75, 79; 438/618, 622, 637, 695, 696, 700, 706, 725, 724, 723, 734

(56) References Cited

U.S. PATENT DOCUMENTS

| 6,025,273 A | * | 2/2000 | Chen et al. | 438/706 |
| 6,136,679 A | * | 10/2000 | Yu et al. | 438/592 |
| 6,319,822 B1 | * | 11/2001 | Chen et al. | 438/637 |
| 6,436,810 B1 | * | 8/2002 | Kumar et al. | 438/633 |

* cited by examiner

Primary Examiner—Mark F. Huff
Assistant Examiner—Saleha Mohamedulla
(74) Attorney, Agent, or Firm—John R. Ley, LLC

(57) ABSTRACT

A carbon-doped hard mask includes a dielectric material containing carbon which is released from the hard mask during a metal etching process. The released carbon is deposited on and bonds to sidewalls of the metal structure during the metal etching process to passivate the sidewalls of the metal structure and prevent lateral etching of the sidewalls during the metal etching process. The released carbon also prevents accumulation of metal residue in open fields.

11 Claims, 3 Drawing Sheets

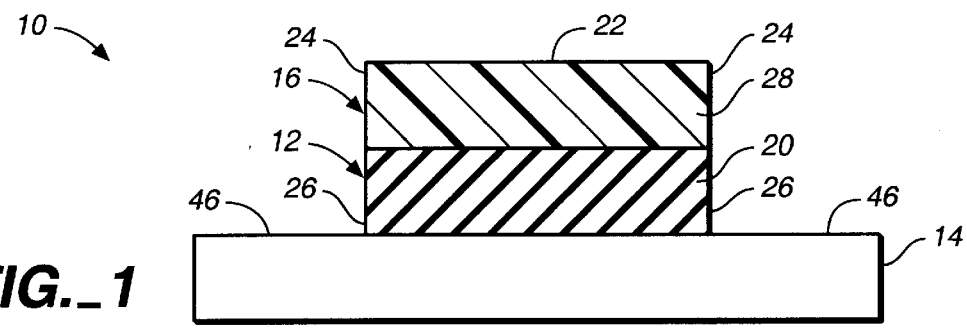
FIG._1
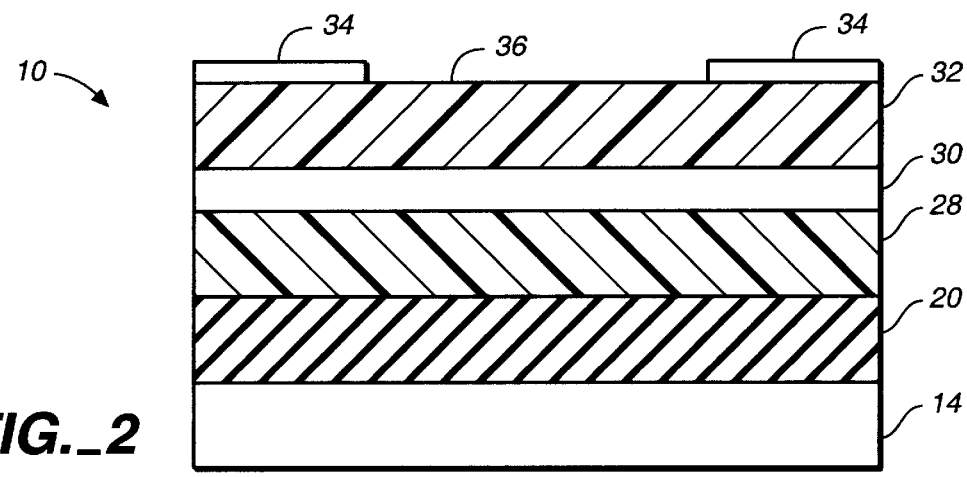
FIG._2
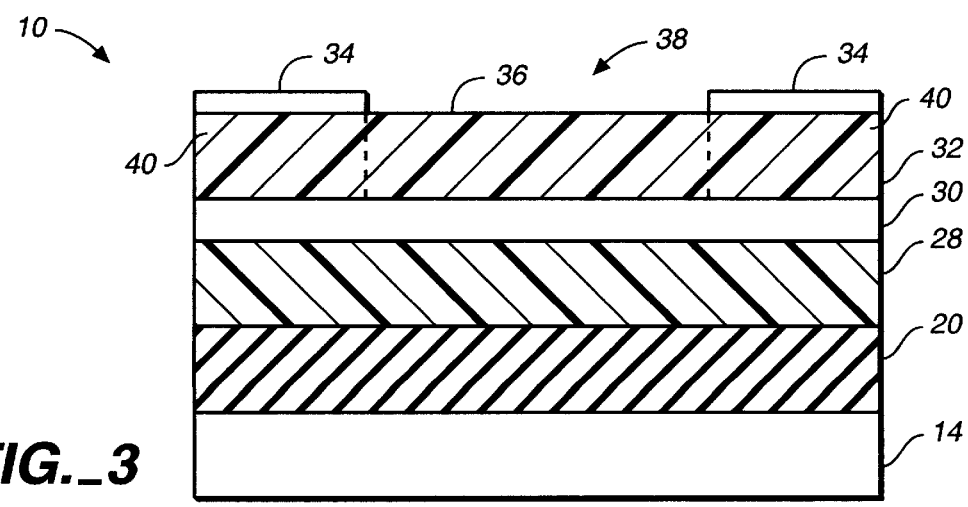
FIG._3

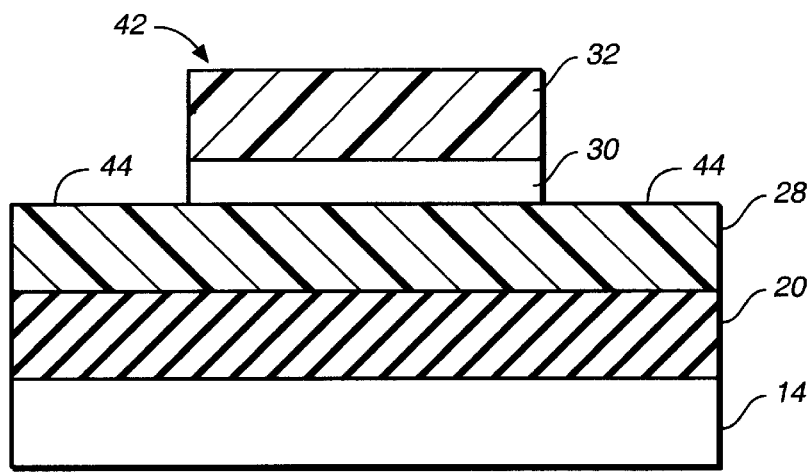
FIG._4
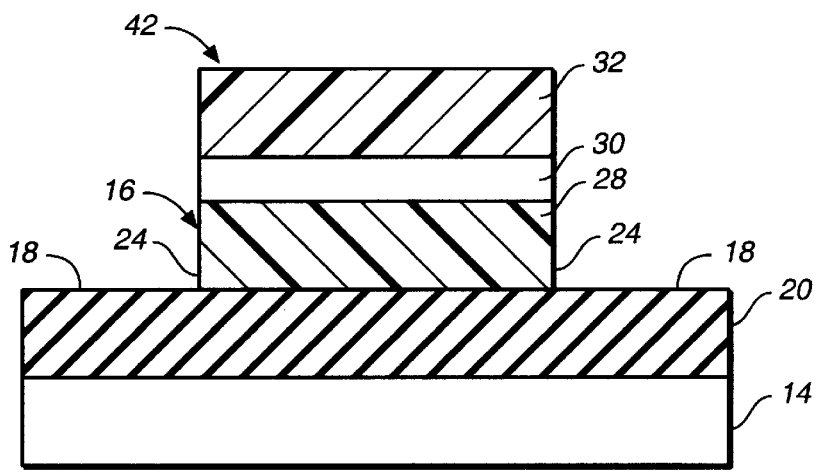
FIG._5
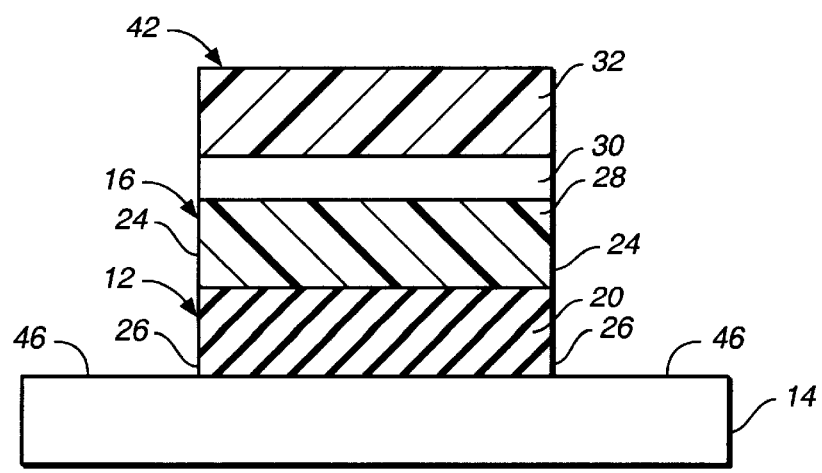
FIG._6

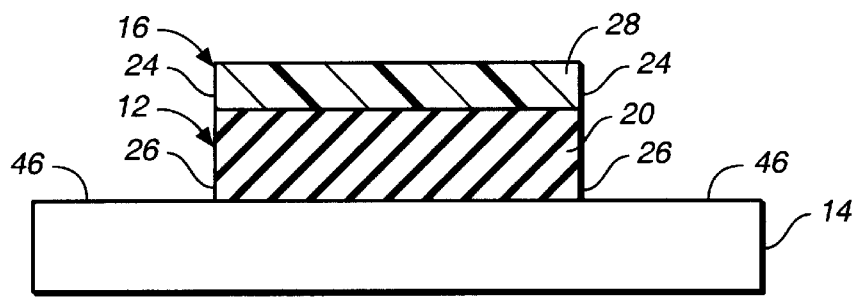
FIG._7
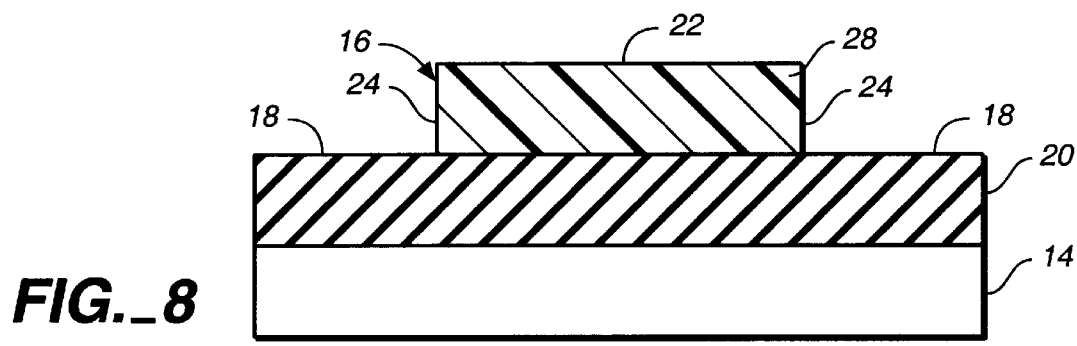
FIG._8
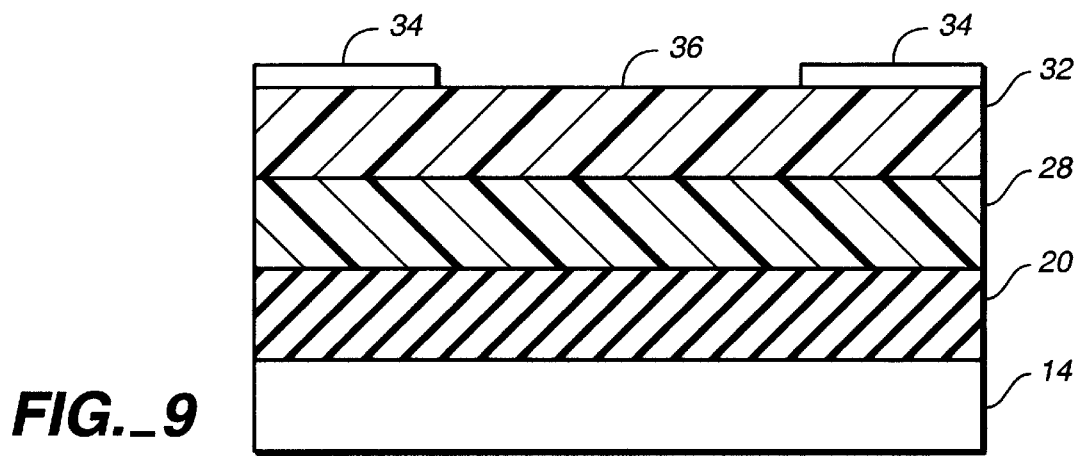
FIG._9

CARBON-DOPED HARD MASK AND METHOD OF PASSIVATING STRUCTURES DURING SEMICONDUCTOR DEVICE FABRICATION

FIELD OF THE INVENTION

This invention relates to semiconductor device fabrication. More particularly, the present invention relates to a new and improved hard mask containing carbon which is released during an etching process and a method of using the hard mask to passivate the sidewalls of a structure formed during the etching process to reduce lateral etching along the sidewalls of the structure, and to reduce metallic residue formation occurring from precipitates in open fields of the structure during certain fabrication steps.

BACKGROUND OF THE INVENTION

A photoresist mask is used in semiconductor device fabrication to protect portions of an underlying material from an etching compound during an etching process. A light-sensitive photoresist material is formed on the surface of the semiconductor structure and portions of the photoresist material are exposed to light through a photolithographic mask. The light that is used to expose the photoresist material through the photolithographic mask typically has a specific wavelength, such as light in the ultraviolet spectrum. The portions of the photoresist which are exposed to the light undergo a photochemical reaction which alters the physical characteristics of the exposed portions. For positive photoresist, the chemical characteristics of photoresist material that is exposed to the light is changed, making the photoresist more easily dissolvable in a developer solution. Those portions of the photoresist material that are not exposed to the light will become more difficult to dissolve in the developer solution. The photoresist material is then developed and the exposed portions of the photoresist material are washed away to form a photoresist mask. Generally an organic anti-reflection layer is also applied during the photoresist process to prevent reflection of light from the underlying material.

The photoresist mask forms a pattern over the underlying material on the wafer and serves to protect portions of the underlying material during an etching process. Portions of the underlying material not protected by the photoresist mask are then etched away or treated in some other manner during the semiconductor device fabrication process. Typically, etching is done with a chemical agent or plasma. In plasma etching, the semiconductor structure is placed in an atmosphere containing a chemical plasma and the wafer is bombarded with ions to remove the unprotected portions of the underlying material. After the underlying material is etched, the photoresist mask is removed from the wafer leaving the desired patterned features in the underlying material on the wafer.

One use of a photoresist mask is to form metal structures as part of the semiconductor device being fabricated on a silicon substrate. A layer of metal is deposited on the silicon substrate and a photoresist mask having the desired metal structure pattern is formed on the metal layer. A metal etching process is used to remove the unprotected metal portions surrounding the desired metal structures. The photoresist mask is then removed. The remaining metal forms the metal structures in the desired pattern. However, the photoresist mask is partially etched away inwardly during the metal etching process which reduces the thickness of the protective photoresist mask over the underlying metal structures. If the thickness of photoresist mask is not sufficient, the mask may be totally etched away, which will result in etching of the underlying metal structures in undesired locations.

The geometries of the desired metal structures also decrease as the minimum photolithographic geometries decrease. In conventional photolithography, a thinner layer of resist material is used in the photoresist mask for the smaller geometries. The proportion of the photoresist mask that is etched away during the etching process is greater with the smaller geometries. As a result, the metal structures formed with the etching process are narrower in width than desired and may not be uniform or well defined because of insufficient thickness in the photoresist mask which is intended to protect the patterned metal structures.

The metal structures are also reduced in width by inadvertent etching in a lateral direction inward from the sidewalls of the metal structures beneath the mask. Although the vertical etch rate through the metal is greater than the lateral or horizontal etch rate of the metal, the sidewalls of the metal structures are etched to some degree. Typically, the metal structures will have jagged or generally poor quality edges resulting from metal that has been etched away from the sidewalls of the metal structures. Under certain conditions, metallic residue can also be formed in open fields of the semiconductor structure when a relatively large area of metal has been etched away.

To reduce the amount of lateral etching and metallic residue, carbon is typically introduced into the chemical plasma during the metal etching process. The carbon bonds to the sidewalls of the metal structures during the metal etching process and passivates the sidewalls of the metal structures. The carbon passivation prevents lateral etching of the metal layer during the metal etching process. The carbon passivation also prevents the accumulation of metallic residue in other locations. However, the introduction of carbon into the chemical plasma may complicate the etching process because carbon must typically be introduced into a gaseous mixture forming the chemical plasma. The carbon introduced into the chemical plasma alters the etching chemistry of the chemical plasma, and the alteration could require changes in or variations to the fabrication process.

A hard mask may be used to protect the metal structures when a thin layer of photoresist material is used in semiconductor wafer fabrication. A hard mask is similar to a conventional photoresist mask but the hard mask is more resistant to etching during the metal etching process. Therefore, the hard mask may be used to produce more uniform and defined metal structures than are possible with a conventional photoresist mask. Typically, the hard mask is a dielectric material such as silicon dioxide or silicon nitride, or another insulating compound formed from silicon, oxygen, nitrogen, tungsten and other metals. However, it is not believed that carbon has been included in the hard mask material.

The hard mask is made by first forming a layer of the dielectric material on the metal layer which has been deposited on the wafer. A photoresist mask is then formed on the dielectric material. The dielectric material is etched from the photoresist mask to form the hard mask having the same pattern as the photoresist mask. The hard mask is then used in the metal etching process to protect the desired underlying metal structure being fabricated while etching away the surrounding metal layer to form the desired metal structure. The metal etching process etches the hard mask at a slower rate than the metal etching process typically etches the photoresist mask. However, the hard mask is still etched to some degree along the sidewalls and on other exposed portions of the hard mask. The desired metal structure being fabricated is better protected from the metal etching process by using the hard mask rather than a conventional photoresist mask. As a result, the metal structure is more uniform and well defined than a metal structure formed with only a photoresist mask, and the size of the metal structure is closer to the original size of the photoresist mask above the metal structure.

It is with respect to these and other considerations that have given rise to the present invention.

SUMMARY OF THE INVENTION

One aspect of the present invention relates to a dielectric hard mask containing carbon to passivate the sidewalls of a structure with the carbon from the hard mask during an etching process. Another aspect of the present invention relates to inhibiting lateral etching of structures during a vertical etching process in semiconductor device fabrication. Another aspect of the present invention relates to the formation of uniform, well defined structures and preventing the reduction in width of the structures during the etching process. Another aspect of the present invention relates to avoiding the introduction of carbon into a chemical plasma for passivation of structures during the metal etching process.

In accordance with these and other aspects, the invention relates to a carbon-doped hard mask formed from a dielectric material containing carbon which is released during etching to passivate sidewalls of a structure and prevent lateral etching of the sidewalls. The invention also includes a method of using a carbon-doped hard mask for passivating side walls of a structure with carbon released from the hard mask while etching the structure.

A more complete appreciation of the present invention and its improvements can be obtained by reference to the accompanying drawings, which are briefly summarized below, by reference to the following detailed description of a presently preferred embodiment of the invention, and by reference to the appended claims.

BRIEF DESCRIPTION OF THE DRAWINGS

FIG. 1 is a vertical cross sectional view of portions of a wafer on which a semiconductor structure has been fabricated using the present invention.

FIGS. 2–9 are vertical cross sectional views showing a sequence of steps involved in fabricating the semiconductor device structure shown in FIG. 1 according to the present invention.

DETAILED DESCRIPTION

A semiconductor structure 10 which has been formed in accordance with the present invention is shown in FIG. 1. The semiconductor structure 10 includes a metal conductor 12 formed on a silicon substrate 14. The silicon substrate 14 is part of a wafer upon which integrated circuits and semiconductor devices are typically fabricated. A hard mask 16 on the metal conductor 12 is formed from a dielectric material containing carbon. The hard mask 16 protects the metal conductor 12, while exposed portions 18 (FIG. 5) of a metal layer 20 from which the conductor 12 is formed are etched away with a metal etching process to form the conductor 12. A top portion 22 and side portions 24 of the hard mask 16 are also etched away releasing carbon from the hard mask 16 during the metal etching process. The released carbon settles on and bonds to sidewalls 26 of the conductor 12 passivating the sidewalls 26. The carbon passivation prevents lateral etching of the conductor 12 along the sidewalls 26 during the metal etching process which transforms the metal layer 20 (FIG. 2) into the conductor 12. As a result, the conductor 12 has a uniform width and well defined edges.

The semiconductor structure 10 shown in FIG. 1 is fabricated by steps starting with forming the metal layer 20 on the silicon substrate 14 as shown in FIG. 2. The metal layer 20 is a layer of conductive metal conventionally used for conductors in a semiconductor device formed on a semiconductor wafer. However, the metal layer 20 may include several layers of conductive materials laminated in a vertical stack. Preferably, the metal layer 20 includes a top layer and a bottom layer of titanium nitride and a layer of aluminum sandwiched between the two layers of titanium nitride. Alternatively, the metal layer 20 may include other conductive materials.

A dielectric layer 28 may be formed on top of the metal layer 20. The dielectric layer 28 is a layer of dielectric material containing carbon. Preferably, the dielectric layer 28 is a film of carbon silicon oxide or a film of silicon oxide doped with carbon. However, the dielectric layer 28 may include another dielectric material containing carbon. Preferably, an anti-reflective coating 30 is formed on top of the dielectric layer 28. The anti-reflective coating 30 prevents reflection of light during the photolithography process. The use of the antireflective coating is optional.

A photoresist material layer 32 is formed as shown in FIG. 9 on the anti-reflective coating 30 as shown in FIG. 2, or in the case where the antireflective coating 30 is not used, directly on the dielectric material. The photoresist material is a conventional photoresist material used in semiconductor wafer fabrication. Typically, the photoresist material is deposited, spun on and then cured into the uniform layer 32. The photoresist material may be a positive photoresist material that makes it soluble in the developer after the photoresist material has been exposed to light, or the photoresist material may be a negative photoresist material that is not soluble in a developer after the negative photoresist material has been exposed to light.

Next as shown in FIG. 3, a photolithography mask 34 is positioned above the cured photoresist material layer 32. The photolithography mask 34 is a conventional mask used in semiconductor device fabrication. The photolithography mask 34 passes light through transparent portions of the photolithography mask 34 but otherwise blocks light from passing through opaque portions of the photolithography mask 34. A predetermined pattern is formed by the transparent and opaque portions of the mask 34, and this pattern is used to form the desired shape of the conductor 12.

Portions 36 of the photoresist material layer 32 are exposed to light 38 from a light source (not shown) located above the photolithography mask 34 as shown in FIG. 3. The light source is a conventional light source used in fabricating semiconductor devices with photolithography. The positive photoresist material layer 32 is then developed with a developer to dissolve the exposed portions 36 making them resistant to etching in a dielectric etching process. The developer is a conventional developer used to develop photoresist. After the photoresist is developed, the exposed portions 40 of the photoresist material layer 32 are washed away or otherwise removed to form a photoresist mask 42 leaving exposed portions 44 of the dielectric layer 28 as shown in FIG. 4.

The exposed portions 44 of the dielectric layer 28 are next etched away with a dielectric etching process forming the hard mask 16 patterned over the metal layer 20 and leaving exposed portions 18 of the metal layer 20 as shown in FIG. 5. The exposed portions 18 of the metal layer 20 are then etched with a metal etching process to form the conductor 12 and leaving exposed portions 46 of the silicon substrate 14 as shown in FIG. 6. The hard mask 16 protects the metal structure 12 of the metal layer 20 during the metal etching process. The unprotected portions 18 of the metal layer 20 are etched downward during the metal etching process.

Portions along the sidewall 24 of the hard mask 16 are also etched away during the metal etching process thereby releasing carbon from the etched portions of the hard mask 16. Some of the carbon settles on the sidewalls 26 of the metal structure 12 and bonds to the sidewalls 26 of the metal structure 12 during the metal etching process. The carbon settles on the sidewalls 26, passivates the metal structure 12 and prevents lateral etching of the sidewalls 26 during the metal etching process, because the chemical plasma does not readily react with the carbon passivated sidewalls 26. The carbon that settles on the sidewalls 26 of the metal structure 12 may directly bond to the sidewalls 26 or the carbon may chemically combine with the chemical plasma in the vicinity of the sidewalls 26 before it bonds to the sidewalls 26. For example, the carbon may chemically react with a chlorine plasma to form carbon chloride or another compound containing carbon and chlorine.

The metal etching also tends to erode the photoresist mask 42 and the antireflective coating 30. Since the primary protection for the metal layer 20 is the hard mask 16, the erosion of the photoresist mask 42 and the coating 30 is of no particular consequence. Compared to the prior art techniques where the photoresist mask 42 is the primary protection for the underlying metal, or compared to the typical dielectric material hard mask without carbon, the carbon passivation of the sidewalls 26 prevents lateral inward etching which would occur as the prior art masks erode inwardly or laterally.

The photoresist mask 42, anti-reflective coating 30, and hard mask 16 and are then removed leaving the conductor 12 on the silicon substrate 14 as shown in FIG. 7. Alternatively, the photoresist mask 42 and anti-reflective coating 30 are removed from the metal layer 20 after the hard mask 16 is formed but before the exposed portions 18 of the metal layer 20 are etched away as shown in FIG. 8. The removal of the photoresist mask 42 and the anti-reflective coating 30 from the hard mask 42 exposes the top portion 22 of the hard mask 26 to the metal etching process. As a result of the etching compounds interacting with the upper exposed surface 22, a greater amount of carbon may be released during the metal etching process to passivate the sidewalls 26 of the metal structure 12.

The exposed portions 18 of the metal layer 20 are then etched with the metal etching process forming the conductor 12 and leaving exposed portions 46 of the silicon substrate 14 as shown in FIG. 1. Remaining portions of the hard mask 16 may be used as a dielectric or insulating layer for other semiconductor devices which are fabricated in conjunction with the metal structure 12 as part of an integrated circuit or semiconductor structure.

While a metal conductor 12 has been used as an example of a semiconductor structure formed by the present invention, other types of semiconductor structures may also be formed by use of the present invention. The structure formed by the present invention must be one which is capable of passivation by a substance which is contained in the dielectric material of the hard mask, and then released by interaction with the etching process to passivate the sidewalls of the underlying substance being etched.

The resistance of the hard mask 16 to etching during the metal etching process and the passivation of the sidewalls 26 during the metal etching process results in a uniform, well-defined conductor 12 and prevents metal residue on open fields of the structure from forming. The introduction of carbon into the chemical plasma is avoided since the hard mask 28 provides a source of carbon for passivation of the metal structure 12. Furthermore, the carbon from the hard mask is deposited on and bonded to the side walls 26 of the metal structure 12 in a more direct and physical manner than carbon in the chemical plasma atmosphere that is chemically bonded to the sidewalls of the metal structure 12 during the metal etching process. Many other advantages and improvements will be apparent after gaining an understanding of the present invention.

The presently preferred embodiment of the present invention has been shown and described with a degree of particularity. This description is of a preferred example of the invention. In distinction to its preferred example, it should be understood that the scope of the present invention is defined by the scope of the following claims, which should not necessarily be limited to the detailed description of the preferred embodiments set forth above.

The invention claimed is:

1. A method of passivating sidewalls of a structure formed under a hard mask from a metal layer substance during an etching process in a semiconductor fabrication process, the method including the steps of:

forming the metal layer substance for the structure from a metal material;

forming the hard mask on the metal layer substance from dielectric material containing carbon;

using the hard mask to etch a pattern into the metal layer substance;

releasing carbon from the dielectric material during the etching process; and etching the metal layer substance in a vertically downward direction to form the structure while the released carbon bonds to and passivates the sidewalls of the structure to prevent lateral etching thereof.

2. A method as defined in claim 1 further comprising the step of:

preventing metallic residue accumulation in an open field of the structure by the released carbon.

3. A method as defined in claim 1 further including the step of:

forming the hard mask using a photoresist mask in a photolithography process.

4. A method as defined in claim 3 further including the step of:

removing the photoresist mask from the hard mask before etching the metal layer substance.

5. A method as defined in claim 3 further including the step of:

simultaneously removing the photoresist mask and the hard mask after etching the metal layer substance.

6. A method as defined in claim 3 further including the step of:

removing the photoresist mask from the hard mask after etching the metal layer substance.

7. A method as defined in claim 6 further including the step of:

selectively removing portions of the hard mask from the metal layer substance leaving remaining portions of the hard mask on the metal layer substance after etching the metal layer substance; and using remaining portions of the hard mask in the semiconductor fabrication process to form part of a semiconductor device.

8. A method as defined in claim 1 further including the step of:

forming the hard mask from carbon silicon oxide.

9. A method of inhibiting lateral etching of a structure formed in a semiconductor fabrication process by vertically etching a metal layer substance to form the structure, comprising the steps of:

forming a dielectric material mask on the metal layer substance containing a passivating agent which is released from the dielectric material mask during etching;

etching the metal layer substance to form the structure using the dielectric material mask while the passivating agent is released from the dielectric material mask to passivate sidewalls of the structure to prevent lateral etching of the sidewalls of the structure as the metal layer substance is etched to form the structure.

10. A method as defined in claim 9 further comprising the step of:

forming the dielectric material mask from a dielectric material which contains the passivating agent in sufficient quantities which when released passivate the sidewalls of the structure.

11. A method as defined in claim 10 wherein the passivating agent is carbon.

* * * * *